(12) United States Patent
He

(10) Patent No.: US 11,488,743 B2
(45) Date of Patent: Nov. 1, 2022

(54) FLEXIBLE FLAT CABLE AND DISPLAY PANEL

(71) Applicant: HKC Corporation Limited, Shenzhen (CN)

(72) Inventor: Huai Liang He, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 599 days.

(21) Appl. No.: 16/313,455

(22) PCT Filed: Mar. 2, 2018

(86) PCT No.: PCT/CN2018/077826
§ 371 (c)(1),
(2) Date: Dec. 26, 2018

(87) PCT Pub. No.: WO2019/091027
PCT Pub. Date: May 16, 2019

(65) Prior Publication Data
US 2021/0233678 A1    Jul. 29, 2021

(30) Foreign Application Priority Data
Nov. 10, 2017 (CN) .......................... 201711105136.9

(51) Int. Cl.
*H01B 5/14* (2006.01)
*H01G 4/228* (2006.01)
(Continued)

(52) U.S. Cl.
CPC ............... *H01B 5/14* (2013.01); *H01G 4/228* (2013.01); *H01G 4/33* (2013.01); *H01G 4/40* (2013.01);
(Continued)

(58) Field of Classification Search
CPC ....................................................... H01B 5/14
(Continued)

(56) References Cited

U.S. PATENT DOCUMENTS

| 6,627,954 B1* | 9/2003 | Seefeldt | ................. H01L 29/94 257/347 |
| 2002/0097352 A1* | 7/2002 | Houdeau | ............. G02F 1/13452 349/58 |

(Continued)

FOREIGN PATENT DOCUMENTS

| CN | 101465481 A | 6/2009 |
| CN | 205793599 U | 12/2016 |

(Continued)

OTHER PUBLICATIONS

International Search Report issued in corresponding International application No. PCT/CN2018/077826, dated Aug. 15, 2018.
(Continued)

*Primary Examiner* — Stanley Tso

(57) ABSTRACT

The present application discloses a flexible flat cable and a display panel. The flexible flat cable includes a substrate, a first terminal and a second terminal. The substrate is insulating, and the first terminal and the second terminal are disposed at the first end and the second end of the substrate respectively, and are coupled with each other by a capacitor assembly.

4 Claims, 2 Drawing Sheets

(51) Int. Cl.
*H01G 4/33* (2006.01)
*H01G 4/40* (2006.01)
*H05K 1/14* (2006.01)
*H05K 1/18* (2006.01)

(52) U.S. Cl.
CPC ............... *H05K 1/148* (2013.01); *H05K 1/18* (2013.01); *H05K 2201/10106* (2013.01)

(58) Field of Classification Search
USPC ........................................................ 361/749
See application file for complete search history.

(56) References Cited

U.S. PATENT DOCUMENTS

| | | |
|---|---|---|
| 2004/0072467 A1 | 4/2004 | Jordan et al. |
| 2014/0205747 A1 | 7/2014 | Yang et al. |
| 2017/0163946 A1* | 6/2017 | Komanduri .......... H04N 9/3179 |
| 2018/0158992 A1* | 6/2018 | Hober-Neuhold ...... H01L 33/50 |

FOREIGN PATENT DOCUMENTS

| | | | |
|---|---|---|---|
| CN | 205039787 | * | 1/2017 |
| CN | 205882136 U | | 1/2017 |
| CN | 107634401 A | | 1/2018 |
| JP | 2007134564 A | | 5/2007 |
| TW | I239701 B | | 9/2005 |

OTHER PUBLICATIONS

Written opinion of the International Search Authority in corresponding International application No. PCT/CN2018/077826, dated Aug. 15, 2018.

* cited by examiner

FLEXIBLE FLAT CABLE AND DISPLAY PANEL

The present application claims priority to the Chinese Patent Application No. 2017111051369 filed with the Chines Patent Office on Nov. 10, 2017 and entitled "FLEXIBLE FLAT CABLE AND DISPLAY PANEL", which is incorporated herein by reference in its entirely.

TECHNICAL FIELD

The present application relates to the technical field of display, and in particular, to a flexible flat cable and a display panel.

BACKGROUND

With the development and advancement of technology, liquid crystal displays have become mainstream display products due to their thin bodies, power saving and low radiation, and have become important display platforms for IT and video products.

According to the driving principle of the liquid crystal display, a system main board connects a red/green/blue compression signal and a control signal power supply with a display area of a display panel through a wire, so that the display panel obtains the required power and signal.

A control board and a printed circuit board are often connected by a flexible flat cable (FFC) structure for data connection. A common flexible flat cable includes a substrate, a first terminal, and a second terminal, where the first terminal and the second terminal are disposed at the two ends of the substrate. The first terminal and the second terminal are connected by a conductive metal wire disposed in the insulating substrate, and at the same time, a first connector and a second connector are also disposed at both ends of the substrate, so as to be connected with corresponding interfaces on the control board and the printed circuit board.

However, some FFC structures have poor anti-interference capability, which is a problem to be solved by a person skilled in the art.

SUMMARY

In view of the above drawbacks of some technologies, against the technical problem to be solved, the present application provides a flexible flat cable and a display panel which can improve anti-interference performance.

To achieve the above Objective, the present application provides a flexible flat cable, which includes:
a substrate;
a first terminal; and
a second terminal;
the substrate is insulating, and the first terminal and the second terminal are disposed at the first end and the second end of the substrate respectively, and are coupled with each other by a capacitor assembly; the capacitor assembly includes:
a first metal film disposed on the first surface of the substrate and coupled with the first terminal; and
a second metal film disposed on the second surface of the substrate and coupled with the second terminal;
the first end of the substrate is provided with a first connector that is in matching connection with the first terminal;
the second end of the substrate is provided with a second connector that is in matching connection with the second terminal;
the first connector includes a first matching groove, the second connector includes a second matching groove, the first terminal is disposed in the first matching groove in a matched mode, and the second terminal is disposed in the second matching groove in a matched mode;
the first metal film is disposed between the first connector and the second connector; and the second metal film is disposed between the first connector and the second connector.

The present application also discloses a flexible flat cable, which includes:
a substrate;
a first terminal; and
a second terminal;
the substrate is insulating, and the first terminal and the second terminal are disposed at the first end and the second end of the substrate respectively, and are coupled with each other by a capacitor assembly.

Optionally, the capacitor assembly includes:
a first metal film disposed on the first surface of the substrate and coupled with the first terminal; and
a second metal film disposed on the second surface of the substrate and coupled with the second terminal.

Optionally, the first end of the substrate is provided with a first connector that is in matching connection with the first terminal;
the second end of the substrate is provided with a second connector that is in matching connection with the second terminal.

Optionally, the first connector includes a first matching groove, the second connector includes a second matching groove, the first terminal is disposed in the first matching groove in a matched mode, and the second terminal is disposed in the second matching groove in a matched mode;
the first metal film is disposed between the first connector and the second connector; and the second metal film is disposed between the first connector and the second connector.

Optionally, the capacitor assembly includes a capacitor disposed in the substrate and conductive lines for connecting the first terminal and the second terminal to the capacitor.

The present application also discloses a display panel, which includes:
a control board, which is configured to generate an input signal;
a printed circuit board, which is configured to receive an output signal: and
a flexible flat cable coupled between the control panel and the printed circuit board;
the flexible flat cable includes:
a substrate:
a first terminal: and
a second terminal;
the substrate is insulating, and the first terminal and the second terminal are disposed at the first end and the second end of the substrate respectively, and are coupled with each other by a capacitor assembly.

Optionally, the capacitor assembly includes:
a first metal film disposed on the first surface of the substrate and coupled with the first terminal; and
a second metal film disposed on the second surface of the substrate and coupled with the second terminal.

Optionally, the first end of the substrate is provided with a first connector that is in matching connection with the first terminal:

the second end of the substrate is provided with a second connector that is in matching connection with the second terminal.

Optionally, the first connector includes a first matching groove, the second connector includes a second matching groove, the first terminal is disposed in the first matching groove in a matched mode, and the second terminal is disposed in the second matching groove in a matched mode;

the first metal film is disposed between the first connector and the second connector; and the second metal film is disposed between the first connector and the second connector.

The flexible flat cable of the present application is provided with the insulating substrate between the first terminal and the second terminal; besides, the first terminal and the second terminal are not in direct contact and connection by a metal wire, alternating current signals are transmitted through the capacitor assembly in a mode of arranging the capacitor assembly between the first terminal and the second terminal, and finally a function of transmitting an alternating current and blocking a direct current is achieved. Therefore, the influence of a direct current signal such as static electricity on the printed circuit board can be avoided, the anti-interference capability of an alternating current signal transmission line for the direct current signal such as the static electricity is improved, and the quality of the display panel is enhanced.

BRIEF DESCRIPTION OF DRAWINGS

The accompanying drawings included are used to provide an optional understanding of the embodiments of the present application. The accompanying drawings form part of the specification, are used to illustrate the embodiments of the present application, and explain the principle of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

Figure 1:
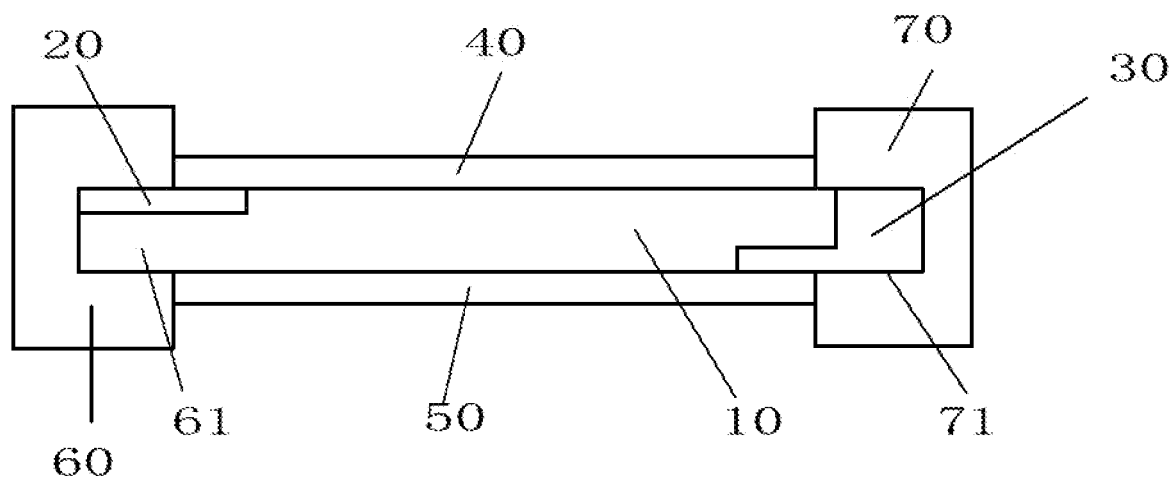
FIG. 1 is a side cross-sectional view of a flexible flat cable of the present application.

Brief description of the accompanying drawings: 10: substrate; 20: first terminal; 30: second terminal; 40: first metal film; 50: second metal film; 60: first connector; 61: first matching groove; 70: second connector; 71: second matching groove; 80: control board; 90 printed circuit board; 100: display panel.

DETAILED DESCRIPTION

The specific structural and functional details disclosed herein are merely representative and are for purposes of describing exemplary embodiments of the present application. The present application, however, may be embodied in many alternative forms and should not be construed as being limited only to the embodiments set forth herein.

In the description of the present application, it is to be understood that the orientation or positional relationship indicated by the terms "center", "transverse", "upper", "lower", "left", "right", "vertical", "horizontal", "top", "bottom", "inside", and "outside" and the like is based on the orientation or positional relationship shown in the accompanying drawings, and is merely for the convenience of description of the present application and simplified description, and does not indicate or imply that the indicated device or members must have a particular orientation and be constructed and operated in a particular orientation. Therefore, the terms should not be construed as limiting the present application. Moreover, the terms "first" and "second" are used for descriptive purposes only and are not to be construed as indicating or implying a relative importance or implicitly indicating the number of technical features indicated. Thus, features defining "first" and "second" may include one or more of the features either explicitly or implicitly. In the description of the present application, "a plurality" means two or more unless otherwise stated. In addition, the term "include" and any variation thereof are intended to cover a non-exclusive inclusion.

In the description of the present application, it should be noted that unless otherwise specifically stated and defined, the terms "install", "connected", and "connect" are to be understood broadly, for example, these terms may be fixed connection or detachable connection, or integral connection, may be mechanical connection or electrical connection, may be direct connection, or indirect connection through an intermediate medium, and may be internal communication of two members. The specific meanings of the above terms in the present application can be understood in the specific circumstances by a person of ordinary skill in the art.

The terms used herein are merely intended to describe the specific embodiments and are not intended to limit the exemplary embodiments. Unless the context clearly dictates otherwise, the singular form "a (an)" used herein is also intended to include plural. It is also to be understood that the terms "comprise" and/or "include" used herein specify the existence of the described features, integers, steps, operations, units and/or assemblies, and do not exclude the existence or adding of one or more other features, integers, steps, operations, units, assemblies auditor combinations thereof.

In the figures, structurally similar units are denoted by the same reference numerals.

Figure 2:
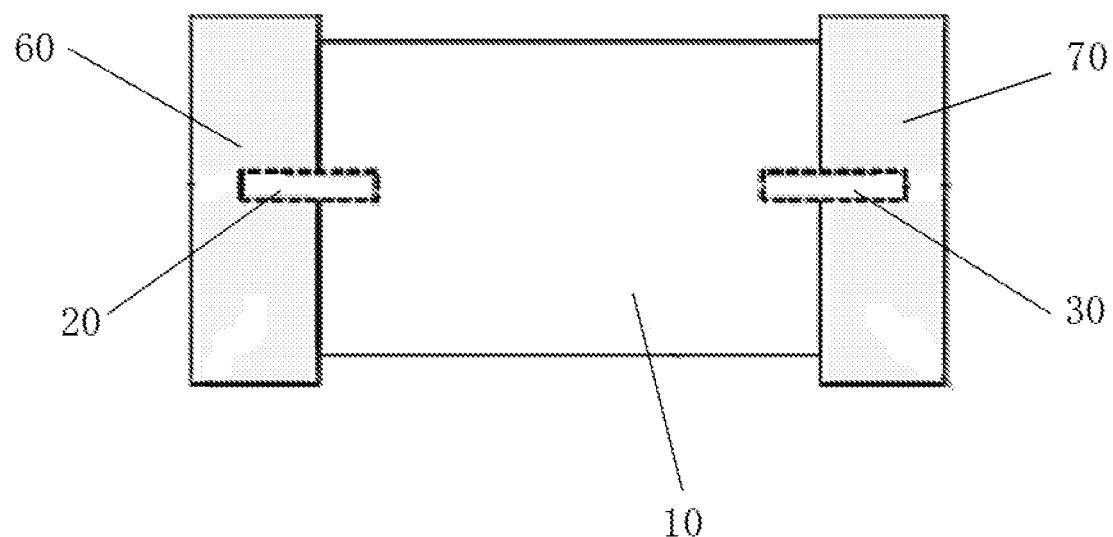
FIG. 2 is a vertical perspective view of a flexible flat cable of the present application.

FIG. 1 is a side cross-sectional view of a flexible flat cable of the present application; and FIG. 2 is a vertical perspective view of a flexible flat cable of the present application. Referring to FIG. 1 and FIG. 2, it can be seen that:

The present application provides a flexible flat cable, which includes:

a substrate 10;

a first terminal 20, which is configured to be connected with an input signal on a control board;

a second terminal 30, which is configured to be connected with an output signal on a printed circuit board;

the substrate 10 is insulating, and the first terminal 20 and the second terminal 30 are disposed at the first end and the second end of the substrate respectively, and are coupled with each other by a capacitor assembly.

The flexible flat cable of the present application is provided with the insulating substrate between the first terminal and the second terminal; besides, the first terminal and the second terminal are not in direct contact and connection by a metal wire, alternating current signals are transmitted through the capacitor assembly in a mode of arranging the capacitor assembly between the first terminal and the second terminal, and finally a function of transmitting an alternating current and blocking a direct current is achieved. Therefore, the influence of a direct current signal such as static electricity on the printed circuit board can be avoided, the anti-interference capability of an alternating current signal transmission line for the direct current signal such as the static electricity is improved, and the quality of the display panel is enhanced.

In this embodiment, optionally, the capacitor assembly includes:

a first metal film 40 disposed on the first surface of the substrate 10 and coupled with the first terminal 20; and a second metal film 50 disposed on the second surface of the substrate 10 and coupled with the second terminal 30. In this embodiment, the first metal film and the second metal film are laid on the upper and lower sides of the insulating substrate, the first metal film and the second metal film are separated by the substrate to form the capacitor assembly, and the first metal film and the second metal film are simultaneously coupled with the first terminal and the second terminal respectively, so that the first terminal and the second terminal transmit an alternating current signal through an equivalent capacitor formed by the first metal film, the second metal film, and the substrate, and finally the effects of transmitting an alternating current and blocking a direct current and improving the anti-interference capability of a transmission line are achieved.

As can be seen in conjunction with FIG. 1 and FIG. 2, in this embodiment, optionally, die first end of the substrate 10 is provided with a first connector 60 that is in matching connection with the first terminal 20, and the first connector 60 is used for being connected with the control board.

The second end of the substrate 10 is provided with a second connector 70 that is in matching connection with the second terminal 30, and the second connector 70 is used for being connected with the printed circuit board. In this embodiment, the two ends of the substrate are provided with the first connector and the second connector respectively, and the first connector and the second connector are connected to the control board and the printed circuit board respectively, to transmit signals of the control board to the printed circuit board side while achieving a certain fixing effect.

As can be seen in conjunction with FIG. 1 and FIG. 2, in this embodiment, optionally, the first connector 60 includes a first matching groove 61, the second connector 70 includes a second matching groove 71, and the first terminal 20 and the second terminal 30 are matched and disposed in the first matching groove 61 and the second matching groove 71;

the first metal film 40 is disposed between the first connector 60 and the second connector 70; and the second metal film 50 is disposed between the first connector 60 and the second connector 70. In this embodiment, the first connector and the second connector are arranged into a shape to be adaptive with a cuboid structure formed by the first terminal, the second terminal, and the substrate, so that the fixed connection and installation can be performed, and a certain fixed effect is achieved.

In this embodiment, optionally, the capacitor assembly includes a capacitor (not shown in the figure) disposed in the substrate 10 and conductive lines (not shown in the figure) for connecting the first terminal and the second terminal to the capacitor. In this embodiment, the capacitor and a related line may be disposed in the substrate to serve as the capacitor assembly, and two ends of the capacitor assembly are connected to the first terminal and the second terminal through conductive lines respectively, thereby achieving transmission of an alternating current signal through the capacitor assembly. At the same time, the anti-interference capability and especially the direct current signal interference resistance of the signal transmission line are improved.

Figure 3:
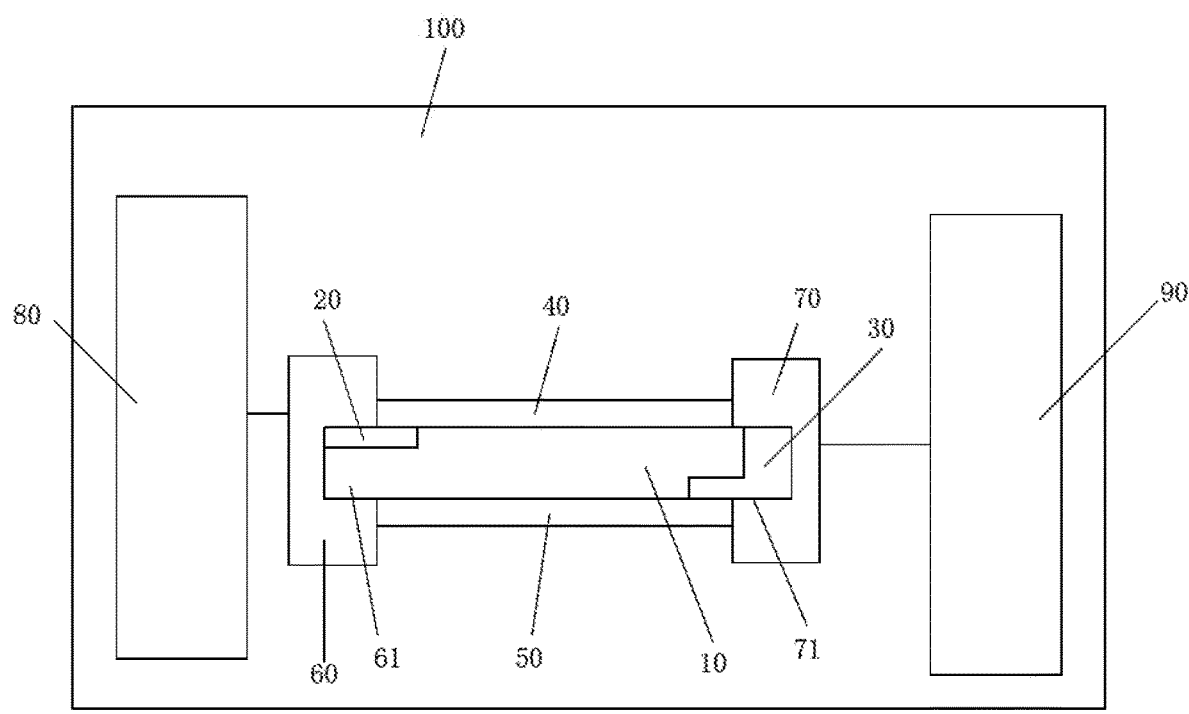
FIG. 3 is a schematic view of a display panel of the present application.

FIG. 3 is a schematic view of a display panel of the present application. Referring to FIG. 3, in conjunction with FIG. 1 and FIG. 2, it can be seen that:

The present application also discloses a display panel 100, which includes:

a control board 80, which is configured to generate an input signal;

a printed circuit board 90, which is configured to receive an output signal; and a flexible flat cable coupled between the control board 80 and the printed circuit board 90;

the flexible flat cable includes:

a substrate 10;

a first terminal 20, which is configured to be connected with an input signal on the control board 80;

a second terminal 30, which is configured to be connected with an output signal on the printed circuit board 90;

the substrate 10 is insulating, and the first terminal 20 and the second terminal 30 are disposed at the first end and the second end of the substrate 10 respectively, and are coupled with each other by a capacitor assembly.

The display panel of the present application includes a control board, a printed circuit board, and a flexible flat cable connecting the two together. The flexible flat cable of the present application is provided with the insulating substrate between the first terminal and the second terminal; besides, the first terminal and the second terminal are not in direct contact and connection by a metal wire, alternating current signals are transmitted through the capacitor assembly in a mode of arranging the capacitor assembly between the first terminal and the second terminal, and finally a function of transmitting alternating current and blocking direct current is achieved. Therefore, the influence of a direct current signal such as static electricity on the printed circuit board can be avoided, the anti-interference capability of an alternating current signal transmission line for the direct current signal such as the static electricity is improved, and the quality of the display panel is enhanced.

In this embodiment, optionally, the capacitor assembly includes:

a first metal film 40 disposed on the first surface of the substrate 10 and coupled with the first terminal 20; and a second metal film 50 disposed on the second surface of the substrate 10 and coupled with the second terminal 30. In this embodiment, the first metal film and the second metal film are laid on the upper and lower sides of the insulating substrate, the first metal film and the second metal film are separated by the substrate to form the capacitor assembly, and the first metal film and the second metal film are simultaneously coupled with the first terminal and the second terminal respectively, so that the first terminal and the second terminal transmit an alternating current signal through an equivalent capacitor formed by the first metal film and the second metal film level and the substrate, and finally the effects of transmitting an alternating current and blocking a direct current and improving the anti-interference capability of a transmission line are achieved.

In this embodiment, optionally, the first end of the substrate 10 is provided with a first connector 60 that is in matching connection with the first terminal 20, and the first connector 60 is used for being connected with the control board 80.

The second end of the substrate 10 is provided with a second connector 70 that is in matching connection with the second terminal 30, and the second connector 70 is used for being connected with the printed circuit board 90. In this embodiment, the two ends of the substrate are provided with the first connector and the second connector respectively, and the first connector and the second connector are connected to the control board and the printed circuit board respectively, to transmit signals of the control board to the printed circuit board side while achieving a certain fixing effect.

In this embodiment, optionally, the first connector 60 includes a first matching groove 61, the second connector 70 includes a second matching groove 71, and the first terminal 20 and the second terminal 30 are matched and disposed in the first matching groove 61 and the second matching groove 71.

The first metal film 40 is disposed between the first connector 60 and the second connector 70; and the second metal film 50 is disposed between the first connector 60 and the second connector 70. In this embodiment, the first connector and the second connector are arranged into a shape to be adaptive with a cuboid structure formed by the first terminal, the second terminal, and the substrate, so that the fixed connection and installation can be performed, and a certain fixed effect is achieved.

In this embodiment, optionally, the capacitor assembly includes a capacitor (not shown in the figure) disposed in the substrate 10 and conductive lines (not shown in the figure) for connecting the first terminal and the second terminal to the capacitor. In this embodiment, the capacitor and a related line may be disposed in the substrate to serve as the capacitor assembly, and two ends of the capacitor assembly are connected to the first terminal and the second terminal through conductive lines respectively, thereby achieving transmission of an alternating current signal through the capacitor assembly. At the same time, the anti-interference capability and especially the direct current signal interference resistance of the signal transmission line are improved.

In this embodiment, the display panel 100 further includes a display module (not shown in the figure), and the display module includes a thin film transistor liquid crystal display (TFT-LCD), or an organic light emitting diode (OLED) display module.

The panel of the present application may be a twisted nematic (TN) panel, an in-plane switching (IPS) panel, or a multi-domain vertical alignment (MVA) panel, and of course, the panel may also be other types of panels, as long as the panels are suitable.

The above are further detailed descriptions of the present application in conjunction with the specific preferred embodiments, and the embodiments of the present application are not limited to these descriptions. For a person of ordinary skill in the art to which the present application pertains, a number of simple deductions or substitutions may also be made without departing from the concept of the present application. All these should be considered as falling within the scope of protection of the present application.

What is claimed is:

1. A flexible flat cable, comprising:
a substrate, wherein the substrate is a single-layer substrate;
a first terminal; and
a second terminal;
the substrate is insulating, and the first terminal and the second terminal are disposed at a first end and a second end of the substrate respectively,
and are directly coupled with each other by a capacitor assembly; wherein the capacitor assembly comprises:
a first metal film disposed on a first surface of the substrate and directly coupled with the first terminal; and
a second metal film disposed on a second surface of the substrate and directly coupled with the second terminal;
the first end of the substrate is provided with a first connector that is in matching connection with the first terminal;
the second end of the substrate is provided with a second connector that is in matching connection with the second terminal;
the first connector comprises a first matching groove, the second connector comprises a second matching groove,
the first terminal is disposed in the first matching groove defined in the first connector in a matched mode,
and the second terminal is disposed in the second matching groove defined in the second connector in a matched mode;
the first metal film is disposed between the first connector and the second connector;
and the second metal film is disposed between the first connector and the second connector;
wherein the first metal film is directly coupled to the first terminal,
and the second metal film is directly coupled to the second terminal;
wherein the first terminal and the second terminal are not directly coupled to each other by a metal wire,
and the capacitor assembly is configured to transmit alternating current signals between the first terminal and the second terminal,
and block a direct current from being transmitted between the first terminal and the second terminal; and
wherein the first connector is configured to be coupled with a control board of a display panel,
and the second connector is configured to be coupled with a printed circuit board of the display panel, to transmit a signal of the control board to the printed circuit board.

2. A flexible flat cable, comprising:
a substrate, wherein the substrate is a single-layer substrate;
a first terminal; and
a second terminal;
the substrate is insulating,
and the first terminal and the second terminal are disposed at a first end and a second end of the substrate respectively,
and are directly coupled with each other by a capacitor assembly;
wherein the first terminal and the second terminal are not directly coupled to each other by a metal wire,
and the capacitor assembly is configured to transmit alternating current signals between the first terminal and the second terminal and block a direct current from being transmitted between the first terminal and the second terminal;
wherein the capacitor assembly comprises a first metal film disposed on a first surface of the substrate and directly coupled with the first terminal,
and a second metal film disposed on a second surface of the substrate and directly coupled with the second terminal;
wherein the first end of the substrate is provided with a first connector that is in a matching connection with the first terminal, the second end of the substrate is provided with a second connector that is in a matching connection with the second terminal;

wherein the first metal film is in contact with both the first connector and the second connector, and the second metal film is in contact with both the first connector and the second connector, wherein the first connector is insulated from the first metal film and the second metal film, and the second connector is insulated from the first metal film and the second metal film;

wherein the first connector comprises a first matching groove, the second connector comprises a second matching groove, the first terminal is disposed in the first matching groove in a matched mode, and the second terminal is disposed in the second matching groove in a matched mode;

the first metal film is disposed between the first connector and the second connector;

and the second metal film is disposed between the first connector and the second connector.

3. The flexible flat cable according to claim 2, wherein the first connector is configured to be coupled with a control board of a display panel, and the second connector is configured to be coupled with a printed circuit board of the display panel, to transmit a signal of the control board to the printed circuit board.

4. The flexible flat cable according to claim 2, wherein the first end of the substrate is partially inserted into the first matching groove together with the first terminal, and the second end of the substrate is partially inserted into the second matching groove together with the second terminal.

* * * * *